United States Patent
Hannon et al.

(10) Patent No.: US 6,486,043 B1
(45) Date of Patent: Nov. 26, 2002

(54) METHOD OF FORMING DISLOCATION FILTER IN MERGED SOI AND NON-SOI CHIPS

(75) Inventors: Robert Hannon, Wappingers Falls, NY (US); Herbert L. Ho, Cornwall, NY (US); Subramanian Iyer, Mount Kisco, NY (US); S. Sundar Kumar Iyer, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/652,711

(22) Filed: Aug. 31, 2000

(51) Int. Cl.[7] .......................... H01L 21/20; H01L 21/76
(52) U.S. Cl. .................... 438/480; 438/407; 438/479
(58) Field of Search ................. 438/480, 479, 438/149, 311, 407

(56) References Cited

U.S. PATENT DOCUMENTS

| 4,763,183 A |   | 8/1988  | Ng et al. |
|---|---|---|---|
| 4,777,147 A |   | 10/1988 | Scott et al. |
| 4,929,566 A |   | 5/1990  | Beitman |
| 4,997,786 A | * | 3/1991  | Kubota et al. ............... 438/480 |
| 5,250,836 A |   | 10/1993 | Miura et al. |
| 5,258,318 A |   | 11/1993 | Buti et al. |
| 5,294,823 A |   | 3/1994  | Eklund et al. |
| 5,327,006 A |   | 7/1994  | Beasom |
| 5,480,832 A |   | 1/1996  | Miura et al. |
| 5,494,846 A | * | 2/1996  | Yamazaki .................... 438/407 |
| 5,592,015 A |   | 1/1997  | Iida et al. |
| 5,702,988 A |   | 12/1997 | Liang |
| 5,731,619 A |   | 3/1998  | Subbanna |
| 5,733,813 A |   | 3/1998  | Chen et al. |
| 5,891,743 A |   | 4/1999  | Lowell |
| 5,918,136 A |   | 6/1999  | Nakashima et al. |
| 5,955,767 A |   | 9/1999  | Liu et al. |
| 5,956,597 A |   | 9/1999  | Furukawa et al. |
| 5,982,006 A |   | 11/1999 | Joyner |
| 6,074,929 A | * | 6/2000  | Thomas ...................... 438/407 |
| 6,090,689 A | * | 7/2000  | Sadana et al. .............. 438/480 |
| 6,232,170 B1 | * | 5/2001 | Hakey et al. ............... 438/243 |
| 6,255,145 B1 | * | 7/2001 | Ajmera et al. .............. 438/151 |

FOREIGN PATENT DOCUMENTS

| JP | 358000185 A |   | 1/1983 |   |
|---|---|---|---|---|
| JP | 61-21468 A | * | 6/1986 | ........... H01L/27/12 |

* cited by examiner

Primary Examiner—Matthew Smith
Assistant Examiner—Lex H. Malsawma
(74) Attorney, Agent, or Firm—Joseph P. Abate

(57) ABSTRACT

A method for forming a semiconductor devices structure includes providing a semiconductor substrate, forming a deep trench continuously in the substrate to separate a first region from a second region, and then forming a silicon-on-insulator region in the first region while maintaining a non-silicon-on-insulator region in the second region. The deep trench has a depth which is at least as deep as the depth of the buried oxide in the substrate. The invention also includes a device structure resulting from the method.

9 Claims, 6 Drawing Sheets

METHOD OF FORMING DISLOCATION FILTER IN MERGED SOI AND NON-SOI CHIPS

FIELD OF THE INVENTION

The invention relates to a semiconductor device that includes both silicon-on-insulator (SOI) and non-SOI devices.

BACKGROUND OF THE INVENTION

Silicon-on-insulator (SOI) technology relates, for example, to high speed MOS and CMOS circuits or chips. According to SOI technology, a layer of insulative material (e.g., silicon oxide) is formed under a thin semiconductor layer (e.g., Si) to reduce the capacitive coupling between the semiconductor layer and the underlying substrate material. The insulator may be formed by implanting oxygen into the workpiece and annealing the workpiece.

In certain circumstances, it is desirable to provide both SOI and non-SOI devices on one chip. However, silicon-on-insulator structures and devices may not be compatible with non-silicon-on-insulator structures and devices. For example, SOI devices, while they may be optimal in some cases, are not readily implementable in trench DRAM technology.

In an SOI substrate, a buried layer of oxide is formed in a silicon substrate. Typically, another layer of substrate underlies the oxide portion. In a typical silicon substrate, the oxide layer may be represented by the formula $SiO_x$. In this formula, x is a number from 1 to 3.

A patterned silicon-on-insulator structure may be formed by forming the buried layer of oxide in a certain region of the silicon substrate. During the patterned SOI formation, high doses of oxygen are implanted. These implants can cause undesirable defects and oxide precipitations in the non-SOI regions of the patterned SOI substrate (wafer).

When the layer of oxide is formed in the substrate to create a silicon-on-insulator region, there is typically a volume expansion when oxidizing the substrate to form the oxide layer. In one case, the volume expansion is about 2.1x. As a result of this volume expansion, large stresses may be built up in the substrate. Thus, trying to pattern the $SiO_x$ layer in the wafer may cause a high level of dislocation to be formed. The dislocation can result in non-manufacturable processes unless they can be filtered out.

SUMMARY OF THE INVENTION

The present invention provides a solution to the above-discussed problems, among others, by providing a method for fabricating both SOI and non-SOI devices on a single semiconductor substrate and a semiconductor device structure that includes both SOI and non-SOI devices on a single semiconductor substrate.

In accordance with these and other objects and advantages, the present invention provides a semiconductor device structure. The structure includes a substrate including at least one silicon-on-insulator (SOI) region and at least one non-silicon-on insulator region. The at least one silicon-on-insulator region and the least one non-silicon-on-insulator region are formed in a pattern in the substrate. A deep trench is arranged continuously in the substrate around sides of the at least one SO region, so as to separate the at least one SOI region from the at least one non-SOI region. The deep trench has a substantially constant depth dimension and a substantially constant width dimension.

The present invention also provides a method for forming a semiconductor device structure. The inventive method includes providing a substrate, forming a deep trench continuously in the substrate to separate a first region from a second region, and then forming a SOI region in the first region while maintaining a non-SOI region in the second region.

Because the deep trench is formed before an oxygen implant step used to help form the SOI region, oxygen from the first region (e.g., SIMOX region) cannot reach the second region (e.g., bulk region) during the step of forming the SOI region. More particularly, during the step of annealing the SIMOX-region, defect formed because of the buried oxide formation will be filtered out of (prevented from) the non-SOI region by the deep trench.

Still other objects and advantages of the present invention will become more readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawing figures and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawing figures, in which.

DETAILED DESCRIPTION OF THE PREFERRED EMBODIMENTS AND BEST MODE

The present invention provides a method and a structure for filtering dislocations to provide a merged SOI and non-SOI semiconductor device structure.

According to an essential aspect of the method of the invention, the SOI region is formed only after forming the deep trench. The SOI region is formed by implanting oxygen into a prospective SIMOX region to form a SIMOX region, and annealing the SIMOX region to form the SOI region. Typically, the SIMOX region and the bulk region are annealed simultaneously.

There may be a plurality of SIMOX and bulk regions in the substrate or wafer.

Figure 7:
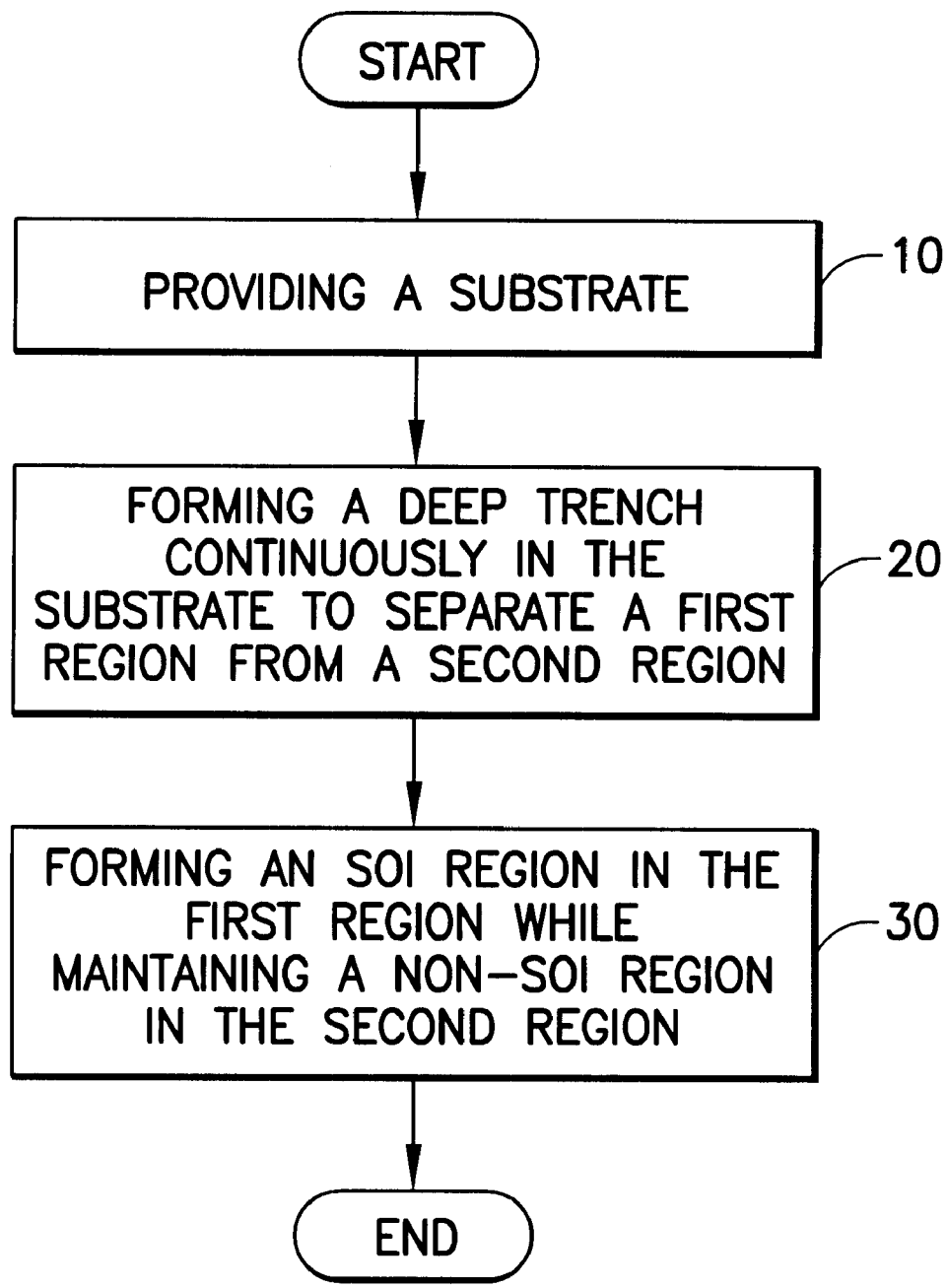
FIG. 7 is a schematic diagram showing an inventive sequence of steps according to one embodiment of the present invention.

FIG. 7 is a flow chart showing an inventive sequence of steps according to the present invention. FIGS. 1–6 are diagrams which further explain the flow chart of FIG. 7.

Figure 1:
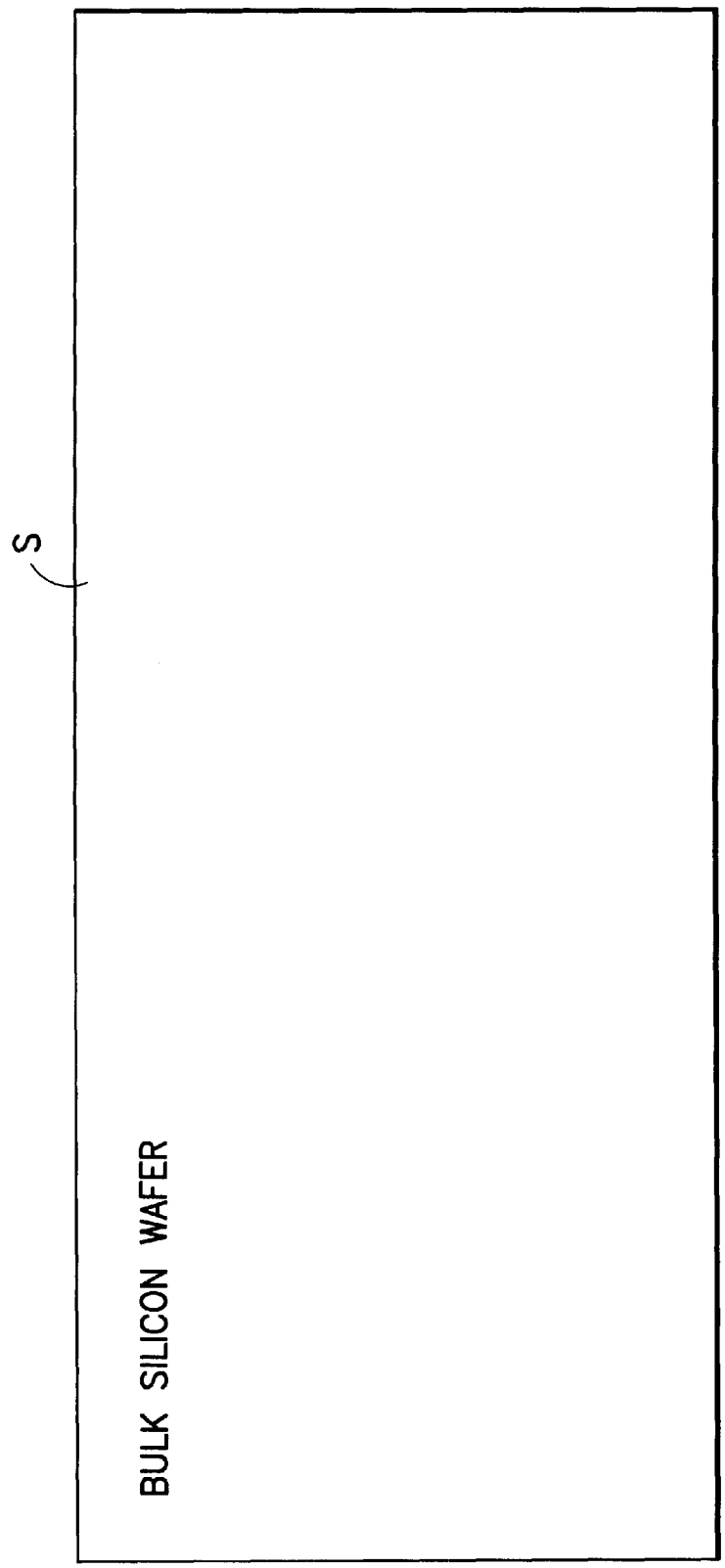
FIG. 1 is a side-schematic view of a typical bulk silicon wafer (substrate) used in the method and structure of the present invention.
Figure 2:
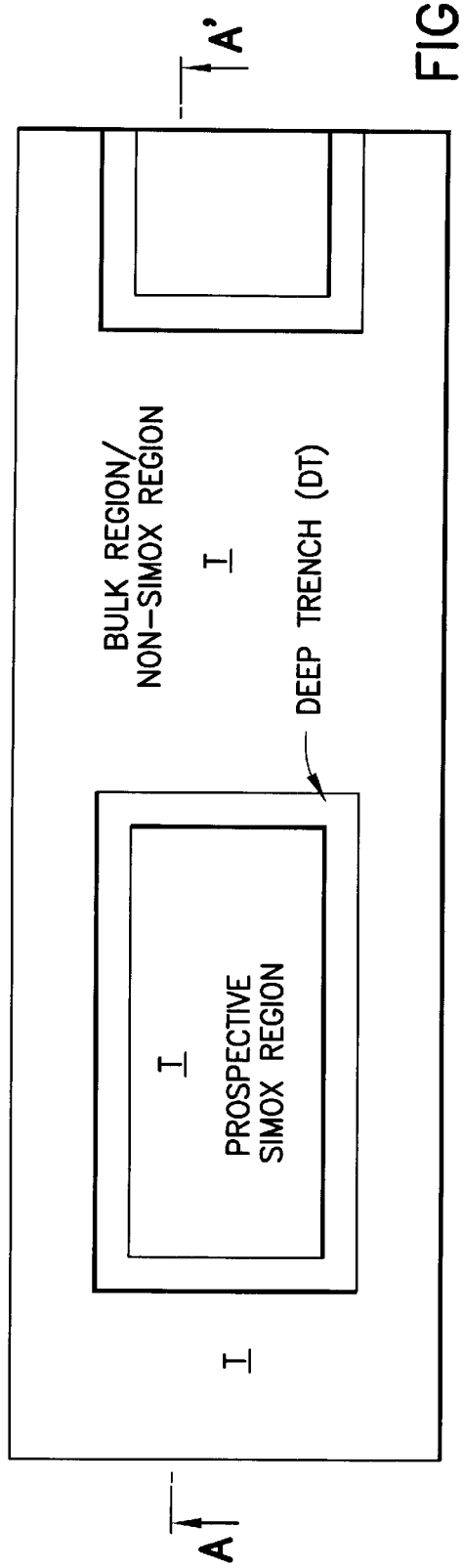
FIG. 2 is a top-schematic view of the substrate after a step of forming a deep trench (DT) in the substrate to separate a prospective SIMOX region from the remaining bulk region.
Figure 3:
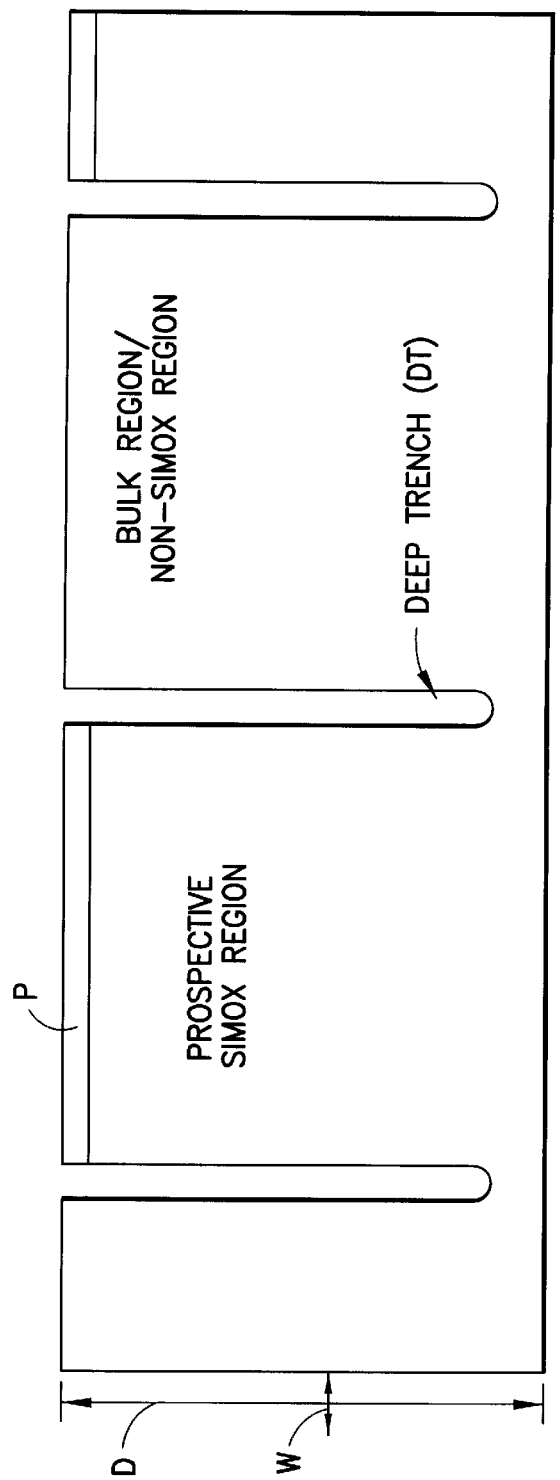
FIG. 3 is a side-sectional schematic view taken in the directions of the arrows A of FIG. 2.
Figure 4:
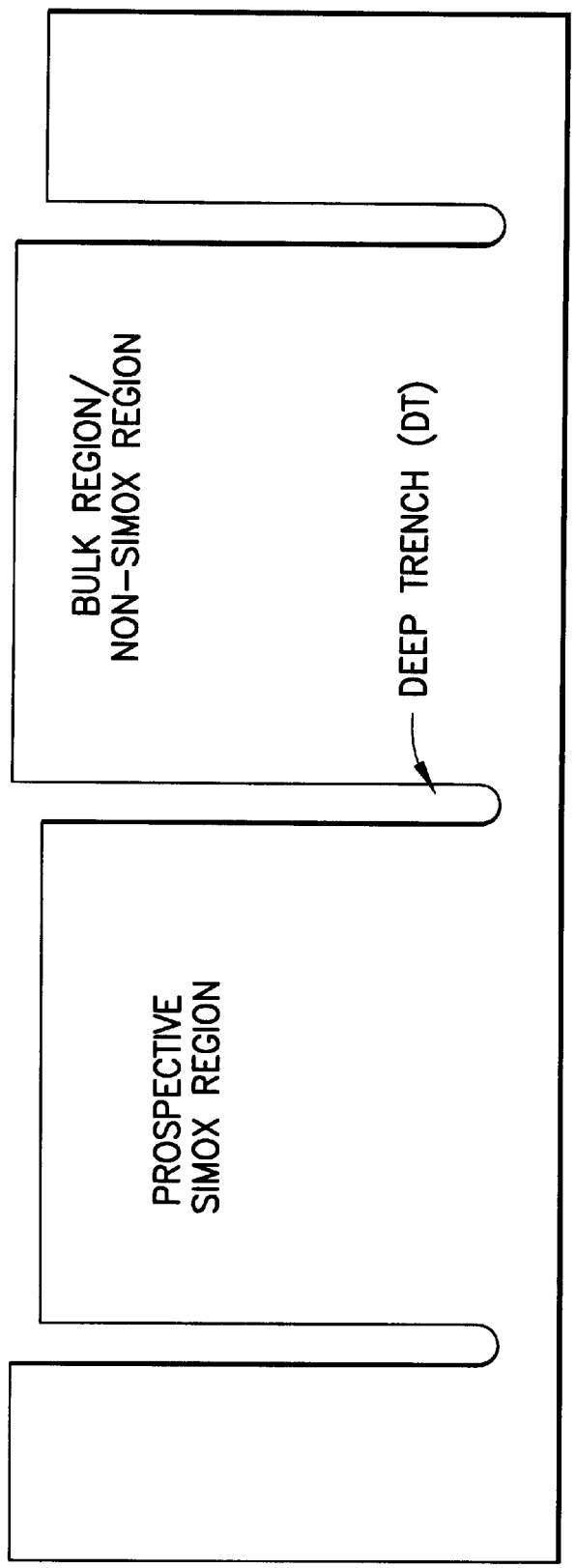
FIG. 4 is a side-sectional schematic view taken in the directions of the arrows A of FIG. 2, after a step of removing a portion of the prospective SIMOX region to accommodate volume expansion.
Figure 5:
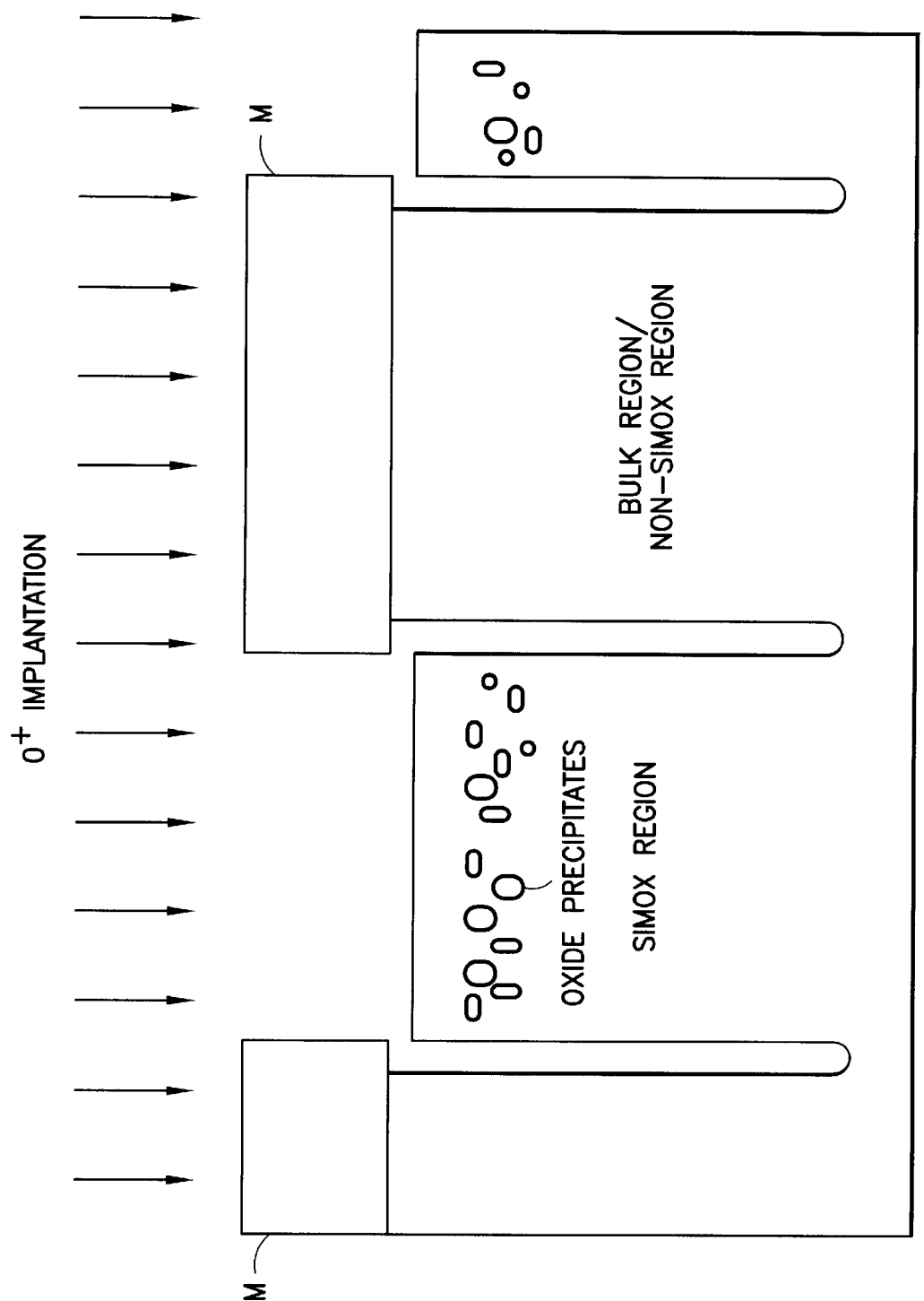
FIG. 5 is a side-sectional schematic view taken in the directions of the arrows A of FIG. 2, showing an oxygen implantation step to form the SIMOX region, performed only after the step of forming the deep trench.
Figure 6:
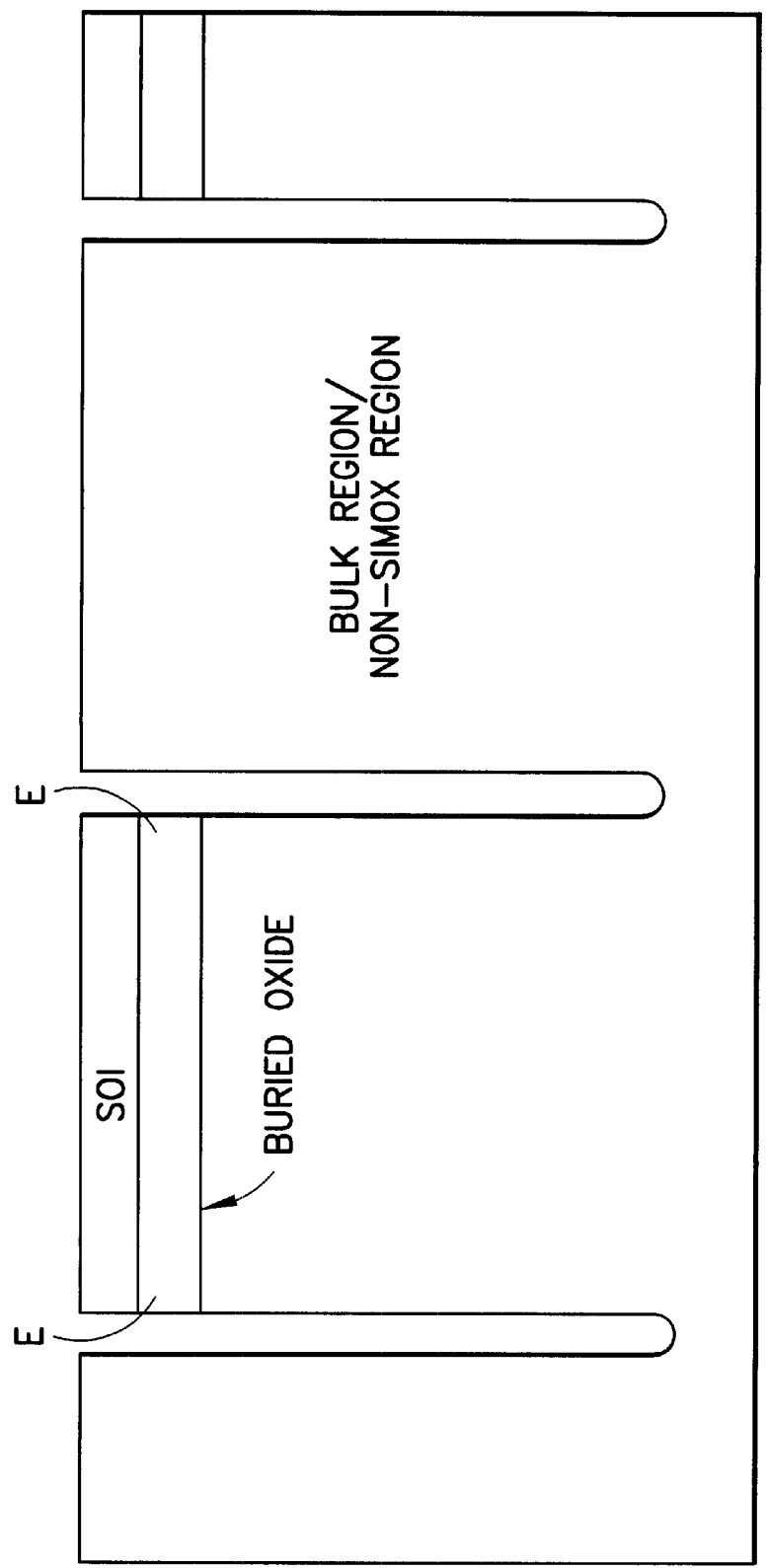
FIG. 6 is a side-sectional schematic view taken in the directions of the arrows A of FIG. 2, after a step of annealing the SIMOX region to form a silicon-on-insulator region.

As shown in FIG. 7 and FIG. 1, a semiconductor substrate S such as a bulk single crystalline silicon substrate or wafer is provided (step 10).

A continuous deep trench (DT) is formed (step 20) by, for example, masking the substrate and etching the masked substrate to isolate or separate a first region (prospective SIMOX region) from a second region (non-SIMOX region). The deep trench (DT) has a substantially (±10%) constant width dimension (W) of preferably less than 0.5 μm, and has a substantially constant depth dimension (D) of greater than 7.5 μm. The DT width may be increased for thicker BOX formations.

The prospective SIMOX region is completely surrounded on all four of its sides, when the trench is formed in a rectangular shape at a top surface T of the substrate. The DT can be formed in other shapes, such as in squares, circles and any other shapes to envelope an area. See FIGS. 2 and 3.

Forming or creating the deep trench can be effected by any suitable technique. See, for example, U.S. Pat. No. 5,956,597, METHOD FOR PRODUCING SOI & NON-SOI CIRCUITS ON A SINGLE WAFER, by Furukawa et al., issued Sep. 21, 1999, and U.S. patent application Ser. No. 09/197,693, filed Nov. 23, 1998, METHOD FOR FILTERING DISLOCATIONS IN MERGED SOI/DRAM CHIPS, by Hannon, et al., which are hereby incorporated in their entireties by reference.

To accommodate for volume expansion of the prospective SIMOX region which occurs during a subsequent step 30 of forming the SOI region, a portion P of the prospective SIMOX region is optionally removed by, e.g., any suitable selective etching. See FIGS. 3 and 4.

During the step 30, the substrate is covered with a hard mask M of deposited oxide/nitride/photo-resist over the region(s) that is (are) designated as the bulk region(s). Oxygen is then implanted into the region designated as the prospective SIMOX region. Because of the presence of the DT separating the SIMOX region from the bulk region, the implanted oxygen will not affect the properties of the bulk region. The implanted substrate is then annealed at a high temperature above, e.g., 1300° C. for more than, e.g., six hours to form a buried oxide layer in the SIMOX region (i.e., to complete a formation of the SO region). See FIGS. 5 and 6.

Techniques for forming SOI regions are well known and need not be further discussed.

See, e.g., U.S. Pat. Nos. 5,956,597, 5,955,767 and 5,918,136, which are all incorporated in their entireties by reference.

The resulting device structure (FIG. 6) has desirable properties such as a planar topography at the tops of the SOI and bulk regions, and less damage at edges (E) of the SOI and bulk regions than damage which is observed when a trench is formed after forming the SOI region.

After forming the SOI region, the deep trench is optionally filled with a dielectric, semiconductor and/or metal material. Preferred materials include, e.g., polycrystalline silicon, amorphous silicon, silicon oxide, $SiO_x$ and/or $Si_xN_4$.

The foregoing description of the invention illustrates and describes the present invention. Additionally, the disclosure shows and describes only preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and /or skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

What is claimed is:

1. A method for forming a semiconductor device structure, comprising;

providing a semiconductor substrate;

forming a deep trench continuously within the substrate to separate a semiconductor first region from a semiconductor second region;

disposing oxygen into the semiconductor first region to form a SIMOX region while maintaining a non-SIMOX region in the semiconductor second region;

annealing the SIMOX region and the non-SIMOX region to form an SOI region in the SIMOX region, said method further comprising removing a portion of the semiconductor first region prior to said step of disposing oxygen into the semiconductor first region, the portion being sufficient to accommodate for an expansion of the semiconductor first region during said step of annealing.

2. The method as claimed in claim 1, wherein said step of forming includes forming the deep trench so that the deep trench has a substantially constant depth of greater than 7.5 μm.

3. The method as claimed in claim 1, wherein said step of forming the deep trench includes a step of forming the deep trench in a rectangular shape at a top suface of the substrate.

4. The method as claimed in claim 1, wherein said step of forming the deep trench includes a step of forming the deep trench so that the deep trench has a substantially constant width of less than 0.5 μm.

5. The method as claimed in claim 1, wherein said step of forming the deep trench includes a step of etching the substrate to form the deep trench.

6. The method as claimed in claim 1, wherein said step of annealing includes annealing the SIMOX region and the non-SIMOX region for at least six hours.

7. The method as claimed in claim 1, wherein said step of annealing includes annealing the SIMOX region and the non-SIMOX region at a temperature of at least 1300°C.

8. The method as claimed in claim 1, wherein the semiconductor substrate is a bulk silicon substrate.

9. The method as claimed in claim 1, wherein said step of removing includes a step of etching the portion of the semiconductor first region.

* * * * *